United States Patent [19]
Hua et al.

[11] Patent Number: 5,288,660
[45] Date of Patent: Feb. 22, 1994

[54] METHOD FOR FORMING SELF-ALIGNED T-SHAPED TRANSISTOR ELECTRODE

[75] Inventors: Chang-Hwang Hua, Palo Alto; Simon S. Chan, Saratoga; Ding-Yuan Day, Sunnyvale, all of Calif.

[73] Assignee: Avantek, Inc., Santa Clara, Calif.

[21] Appl. No.: 11,998

[22] Filed: Feb. 1, 1993

[51] Int. Cl.$^5$ .................. H01L 21/283; H01L 21/312
[52] U.S. Cl. .......................... 437/187; 437/39; 437/40; 437/177; 437/944; 437/912; 437/229; 156/644; 156/659.1; 156/661.1
[58] Field of Search .................. 437/39, 40, 41, 912, 437/944, 229, 187, 175, 176, 177; 156/644, 659.1, 661.1

[56] References Cited

U.S. PATENT DOCUMENTS

| | | | |
|---|---|---|---|
| 4,679,305 | 7/1987 | Morizuka | 29/576.3 |
| 4,705,596 | 11/1987 | Gimpelson et al. | 156/643 |
| 4,758,305 | 7/1988 | Bonifield et al. | 156/661.1 |
| 4,861,422 | 8/1989 | Kudou et al. | 156/640 |
| 4,865,952 | 9/1989 | Yoshioka et al. | 437/229 |
| 4,871,684 | 10/1989 | Glang et al. | 437/31 |
| 4,871,685 | 10/1989 | Taka et al. | 437/33 |
| 4,896,203 | 1/1990 | Kajikawa | 357/34 |
| 4,904,612 | 2/1990 | Zwicknagi et al. | 437/31 |
| 4,927,774 | 5/1990 | Welbourn et al. | 437/31 |
| 4,959,326 | 9/1990 | Roman et al. | 437/40 |
| 4,979,010 | 12/1990 | Brighton | 357/34 |
| 4,980,304 | 12/1990 | Chin et al. | 437/31 |
| 5,001,534 | 3/1991 | Lunardi et al. | 357/34 |
| 5,008,210 | 4/1991 | Chiang et al. | 437/33 |
| 5,053,348 | 10/1991 | Mishra et al. | 437/41 |
| 5,155,653 | 10/1992 | Atkinson | 437/40 |
| 5,185,277 | 2/1993 | Tung et al. | 437/39 |
| 5,219,713 | 6/1993 | Robinson | 437/231 |

FOREIGN PATENT DOCUMENTS

| | | | |
|---|---|---|---|
| 0410385 | 1/1991 | European Pat. Off. | 437/912 |
| 8902652 | 3/1989 | World Int. Prop. O. | 437/39 |

*Primary Examiner*—T. N. Quach
*Attorney, Agent, or Firm*—Christie, Parker & Hale

[57] ABSTRACT

A T-shaped electrode is formed on a semiconductor substrate by first forming a dielectric film on the substrate. A first layer of photoresist is applied on the upper surface of the dielectric film, and a second layer of photoresist is applied over the first layer of photoresist. The first and second layers of photoresist have different optical properties, requiring different wavelengths of ultraviolet for exposure before developing. Portions of the first and second photoresist layers and the dielectric film are selectively removed by photolithographic techniques with one masking step for forming an opening to the substrate. The first and second photoresist layers adjacent to the opening are ion etched to expose the upper surface of the dielectric film adjacent to the opening. A portion of the first photoresist layer adjacent to the opening is removed to undercut the second photoresist layer. Metal is deposited in the opening and on the exposed upper surface of the dielectric film to form a T-shaped electrode. The first and second photoresist layers are then removed, thereby also removing metal deposited on top of the second layer of photoresist.

17 Claims, 5 Drawing Sheets

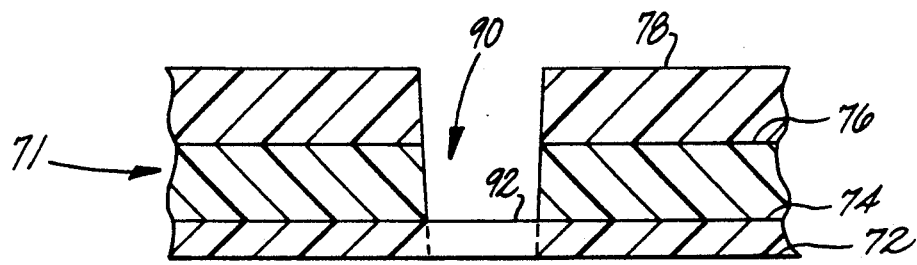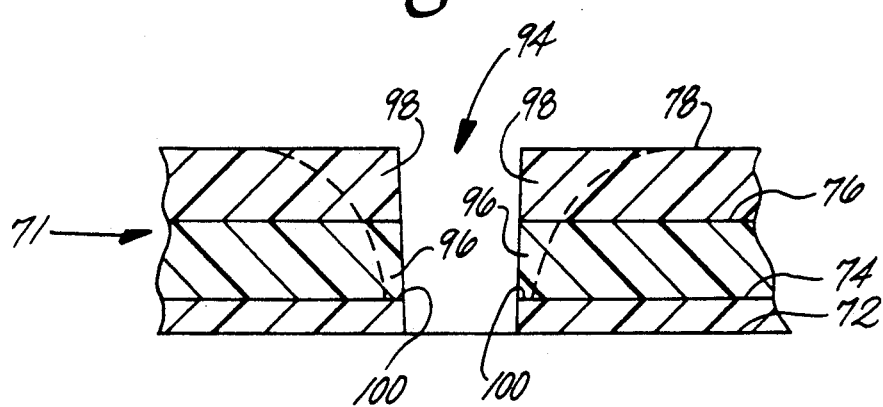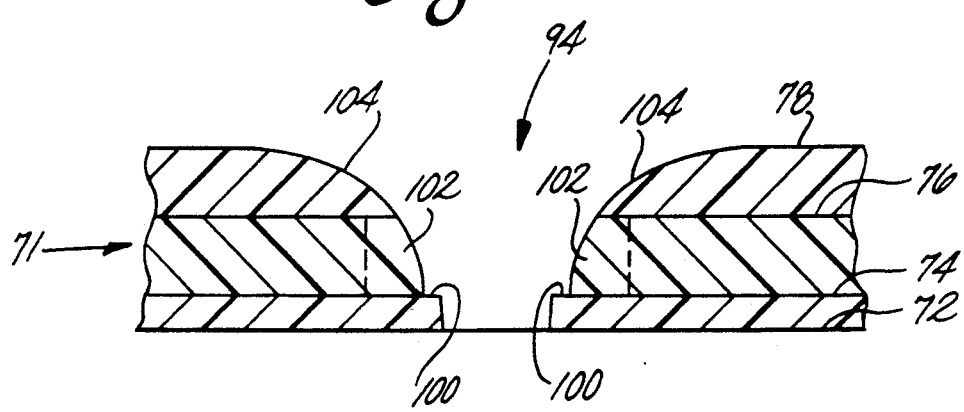

METHOD FOR FORMING SELF-ALIGNED T-SHAPED TRANSISTOR ELECTRODE

BACKGROUND OF THE INVENTION

The present invention relates to transistor electrodes and, more particularly, to a T-shaped transistor electrode and a method of manufacturing it.

For transistor electrodes, such as those used to make contact with transistor emitters, it is often desired for the electrode to have a T-shaped cross-section. The T-shape includes an upper cross-piece portion which is perpendicular to a lower stem portion. One advantage of using a T-shape electrode is that the upper cross-piece portion is usually wide and thus capable of carrying relatively large current, while the lower stem portion is narrow to reduce adverse parasitic effects at the point where the electrode makes contact with the semiconductor substrate.

Another advantage of a T-shaped electrode is that the upper cross-piece portion overhangs the lower stem portion. This overhang permits the electrode to function as a "mask" when depositing neighboring electrodes. For example, a base electrode may be deposited next to a T-shaped emitter electrode. In this scenario the overhanging portion of the upper cross-piece portion of the T-shape functions as a "mask" for one side of the base electrode during its deposition.

Prior art T-shaped electrodes are typically formed on transistor substrates by using at least two mask/metal deposition steps. The first mask and metal deposition step is used to define the stem portion of the T-shape, and the second mask and metal deposition step is used to define the upper cross-piece portion of the T-shape. The use of two mask steps results in a two piece electrode, the lower stem portion being formed from one layer of metal, and the upper cross-piece portion being formed from another layer of metal.

The performance of a heterojunction bipolar transistor can be improved by placing the emitter and base electrodes very close to each other. As will be explained in detail below, however, when prior art T-shaped emitter electrodes are used as "masks" for forming base electrodes, the resulting base electrodes are often shorted with the emitter electrodes. A transistor will not operate if its emitter electrode is shorted with its base electrode.

FIG. 1 illustrates a prior art transistor emitter electrode 20 having a T-shaped cross-section. The electrode 20 is formed on a transistor substrate 26. The emitter electrode 20 includes two separate pieces of electrode metal: an upper cross-piece portion 22 and a lower stem portion 24. The upper cross-piece portion is positioned perpendicular to the lower stem portion. Furthermore, the upper cross-piece portion is ideally centered over the lower stem portion. Two base electrodes 28 and 30 are located in base wells 32 and 34.

The lower stem portion of the T-shaped emitter electrode is deposited on the transistor substrate 26 during a first mask and metal deposition process. The upper cross-piece portion is deposited on the lower stem portion during a second mask and metal deposition process. Each of the mask and metal deposition processes typically requires application of a layer of photoresist, masking of the photoresist, exposure of the photoresist to ultraviolet light, removal of the exposed region, and deposition of metal.

The base wells 32 and 34 extend beneath each side of the upper cross-piece portion, as indicated by reference numerals 36 and 38, to provide clearance between the base and emitter electrodes. The purpose of the extension of the base walls is to permit the upper cross-piece portion to be used as a "mask" when the base electrodes 28 and 30 are deposited in the base wells. Using the upper cross-piece portion as a "mask" results in the right edge of one base electrode 28 being aligned with the left edge of the upper cross-piece portion, and the left edge of the other base electrode 30 being aligned with the right edge of the upper cross-piece portion.

The upper cross-piece portion includes overhang regions 40 and 42 which overhang the lower stem portion. In order for the base electrodes to be positioned properly with respect to the lower stem portion, the overhang regions should be equal in length. The overhang regions will be equal in length when the lower stem portion is positioned in the center of the upper cross-piece portion, or in other words, when the upper cross-piece portion is "aligned" with the lower stem portion. When the upper cross-piece portion and lower stem portion are aligned, the base electrodes 28 and 30 are aligned with respect to the T-shaped emitter electrode.

Thus, it is advantageous for a T-shaped electrode to have the upper cross-piece portion of the T-shape aligned with the lower stem portion of the T-shape. In practice, however, prior art T-shaped electrodes often resemble the emitter electrode 44 shown in FIG. 2 having misaligned upper and lower portions. The two piece emitter electrode includes an upper cross-piece portion 46 and a lower stem portion 48. As shown, the upper cross-piece portion is misaligned with the lower stem portion. In other words, the lower stem portion is not positioned in the center of the upper cross-piece portion. This results in unequal overhang regions of the upper cross-piece portion.

Base wells are usually formed in a substrate subsequent to formation of the emitter electrode. As discussed above, the base wells should extend beneath each side of the upper cross-piece portion. In the transistor shown in FIG. 2, when base wells 50 and 52 are formed in the substrate 54, base well 52 must undercut the lower stem portion 48 in order to underlie the upper cross-piece portion. This undercutting of the lower stem portion is due to the upper cross-piece portion being misaligned with the lower stem portion. When the upper cross-piece portion is used as a "mask" for depositing base electrode 58, the resulting base electrode 58 is shorted with the lower stem portion 48 at point 60.

Another problem caused by the parts of the emitter electrode being misaligned is that the distance between one base electrode 56 and the lower stem portion 48 is greater than the distance between the other base electrode 58 and the lower stem portion. Device performance is decreased when the base electrodes are located unequal distances from the emitter electrode. Device performance is decreased because the conductive channels which are formed in the substrate 54 between each of the base electrodes and the emitter electrode during device operation are not equal in length.

One way to prevent base and T-shaped emitter electrodes from shorting together is to increase the distance between them. However, as the separation between the emitter and base electrodes increases, the device performance decreases. Thus, this is not a desirable solution to the problem.

Thus, there has developed a need for a T-shaped electrode capable of having a neighbor electrode deposited very close by without the two electrodes coming into contact with each other.

SUMMARY OF THE INVENTION

The present invention provides a method of forming a T-shaped electrode on a semiconductor substrate. A dielectric film is first formed on the substrate, a first layer of photoresist is then applied on the upper surface of the dielectric film, and a second layer of photoresist is applied over the first layer of photoresist. The first and second layers of photoresist have different optical properties. Portions of the first and second photoresist layers and the dielectric film are selectively removed to form an opening to the substrate. The first and second photoresist layers adjacent to the opening are removed to expose the upper surface of the dielectric film adjacent to the opening. A portion of the first photoresist layer adjacent to the opening is removed to undercut the second photoresist layer. Metal is deposited in the opening and on the exposed upper surface of the dielectric film. The first and second photoresist layers are then removed.

BRIEF DESCRIPTION OF THE DRAWINGS

A better understanding of the features and advantages of the present invention will be obtained by reference to the following detailed description of the invention and accompanying drawings which set forth an illustrative embodiment in which the principles of the invention are utilized.

FIG. 7 is a cross-sectional view of the structure of FIG. 6 having an opening in the first layer of photoresist.

FIG. 8 is a cross-sectional view of the structure of FIG. 7 having an opening in the dielectric film.

FIG. 9 is a cross-sectional view of the structure of FIG. 8 having portions of the first and second photoresist layers adjacent to the opening removed.

DETAILED DESCRIPTION OF THE PREFERRED EMBODIMENT

The present invention provides a way to keep base electrodes from shorting with T-shaped emitter electrodes. The present invention includes a T-shaped electrode, and a method of manufacturing it, which has an upper cross-piece portion aligned with the lower stem portion.

Figure 3:
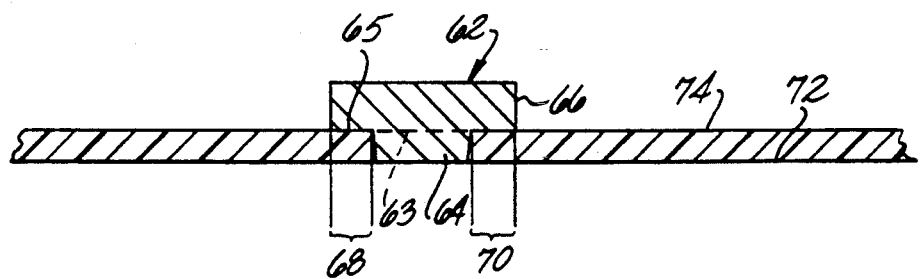
FIG. 3 is a cross-sectional view of a self-aligned T-shaped transistor electrode in accordance with the present invention.

FIG. 3 illustrates a T-shaped transistor electrode 62 in accordance with the present invention. The T-shaped transistor electrode 62 is formed using a method which uses only one mask step. It has an upper cross-piece portion 66 which is perpendicular to and centered over a lower stem portion 64. In other words, a side 63 of the lower stem portion 64 is joined and substantially centered along a side 65 of the upper cross-piece portion 66. The side 65 of the upper cross-piece portion is longer than the side 63 of the lower stem portion. The upper cross-piece portion includes two overhang regions 68 and 70 which overhang the lower stem portion. The two overhang regions 68 and 70 are substantially equal in length, which results in the upper cross-piece portion being aligned with the lower stem portion.

Figure 1:
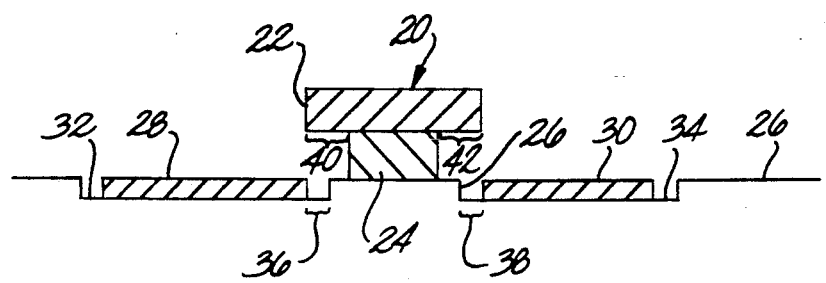
FIG. 1 is a cross-sectional view of a prior art T-shaped transistor emitter electrode having an upper cross-piece portion ideally centered over a lower stem portion.
Figure 2:
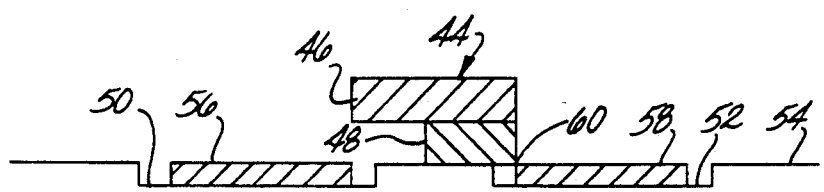
FIG. 2 is a cross-sectional view of a common prior art T-shaped transistor emitter electrode having misaligned upper cross-piece and lower stem portions.

Unlike the prior art electrodes of FIGS. 1 and 2, the electrode 62 shown in FIG. 3 also includes a SiN dielectric film 74 over the substrate 72. The dielectric film extends under the overhang regions 68 and 70. As will become apparent in the discussion below, the dielectric film is used in forming the emitter electrode. All or part of the dielectric film may or may not be removed upon completion of the electrode. If base wells are to be formed in the substrate 72, portions of the dielectric film will have to be removed. However, even if base wells are formed, it is believed that if portions of the dielectric film remain under the overhang regions, the presence of these portions of the dielectric film will not significantly affect the electrode or transistor performance.

Because the aligned T-shaped transistor electrode may be deposited on a transistor substrate using only one mask step, the difficult and expensive task of aligning an upper cross-piece portion with a lower stem portion during a second mask step is eliminated. The method of manufacturing the T-shaped electrode (discussed below) is such that the upper cross-piece portion 66 is "self-aligned" with the lower stem region 64.

Figure 4:
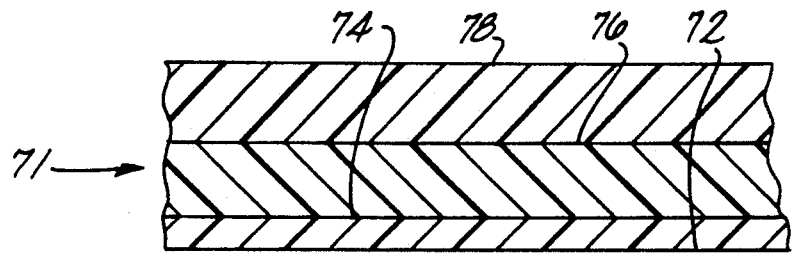
FIG. 4 is a cross-sectional view of a substrate having a dielectric film and two layers of photoresist formed thereon.

FIGS. 4 through 14 illustrate a method of forming the T-shaped electrode of FIG. 3 on the transistor substrate 72. Referring to FIG. 4, the transistor substrate is preferably vacuum baked at 120° C. for 30 minutes. A SiN dielectric film 74 is then deposited on the substrate. The dielectric film preferably has a thickness of about 350 to 400 Å.

A first layer of positive photoresist 76, preferably having a thickness of about one micrometer, is then applied by spinning it over the dielectric film. Spinning is performed at a rate of about 5000 revolutions per minute (RPM). An exemplary positive photoresist 76 is part number SAL 110-PLI, manufactured by Shipley. The wavelength of ultraviolet light required to expose this photoresist is 260 nanometers. After the photoresist is applied, the structure 71 may then be baked at 200° C. for 30 minutes.

A second layer of positive photoresist 78, having a different optical property from the first layer of photoresist, is then applied by spinning it over the first layer of photoresist. The second layer of positive photoresist preferably has a thickness of about two micrometers. Spinning is performed at a rate of about 5000 RPM.

The difference in the optical properties of the first and second photoresists should be such that they become exposed at a different wavelengths of ultraviolet light. Preferably, the exposure wavelength of the second photoresist should be greater than the exposure wavelength of the first photoresist. Part number 1450 photoresist, manufactured by Shipley may be used for the second photoresist. The wavelength of ultraviolet light required to expose this photoresist is 365 nanometers. After the photoresist is applied, the structure 71 may then be baked at 90° C. for 30 minutes.

Figure 5:
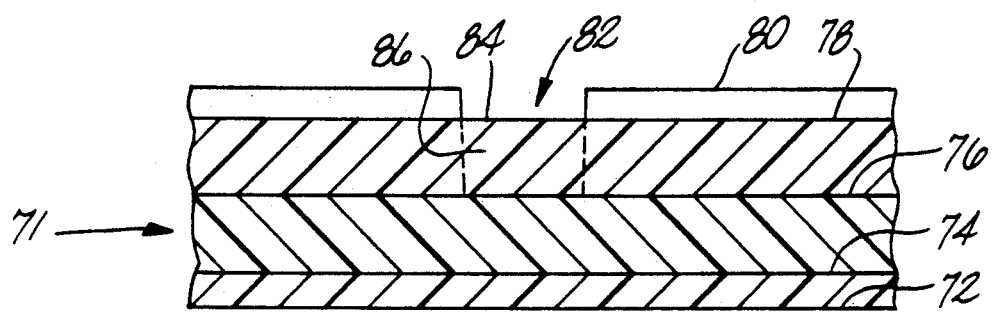
FIG. 5 is a cross-sectional view of the structure of FIG. 4 having a mask placed thereon.

Referring to FIG. 5, the next step is to form an opening through the second photoresist layer 78. A mask 80 is placed over the second photoresist layer. The mask may be a quartz mask or projected from a stepper. An opening 82 in the mask defines where the opening in the photoresist will be located. Note that this is the only mask step performed in this method.

The surface 84 of the second photoresist layer defined by the mask opening is then exposed to ultraviolet light in order to create an exposed region 86. The ultraviolet light used for this exposure preferably has a wavelength of 365 nanometers, and exposure lasts for about six seconds.

The exposed region 86 in the second photoresist layer is then developed. An exemplary developer is Microposit Concentrate Developer manufactured by Shipley. This developer is mixed with water in the ratio of 1:1, and development lasts for approximately one minute. The developing forms an opening in the second photoresist layer by removing the exposed region 86. The structure 71 may be inspected to insure that all of the exposed region of the second photoresist layer has been removed.

Figure 6:
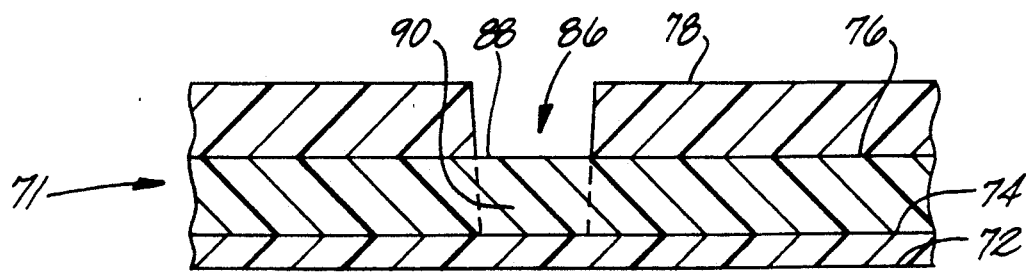
FIG. 6 is a cross-sectional view of the structure of FIG. 4 having an opening in the second layer of photoresist.

Referring to FIG. 6, the next step is to expose the surface 88 of the first photoresist layer 76 defined by the opening in the second photoresist layer to ultraviolet light in order to form an exposed region 90 in the first photoresist layer. The ultraviolet light used for this exposure is preferably deep ultraviolet (DUV) light having a wavelength of 260 nanometers. Exposures last for about 300 seconds.

The exposed region 90 in the first photoresist layer is then developed. Exemplary developer used is part number SAL-101 Microposit Developer, manufactured by Shipley. Development lasts for about 30 seconds. This developing forms an opening in the first photoresist layer by removing the exposed region 90. The structure may then be inspected to insure that all of the exposed region of the first photoresist layer has been removed. A light oxygen plasma cleaning step may be used to remove all of the remaining exposed region of the first photoresist layer. This oxygen plasma cleaning is preferably performed at 200 Watts for about four minutes.

Referring to FIG. 7, a region 92 of the dielectric film 74 defined by the opening in the first photoresist layer 90 is etched away. This etching forms an opening in the dielectric film which exposes a portion of the substrate that will form the emitter contact. The etching may be performed by either dry or wet etching. If dry etching is used, then carbon tetrafluoride ($CF_4$) is the preferred substance. If wet etching is used, then a buffered hydrogen fluoride etch (BOE) is used for about ten seconds and rinsing in water for about one minute is preferred.

Referring to FIG. 8, there is illustrated the structure 71 with the exposed regions 86 and 90 of the second and first photoresist layers 78 and 76 and the etched region 92 of the dielectric film 74 removed. The opening in the second photoresist layer, the opening in the first photoresist layer, and the opening in the dielectric film form a single opening 94 to the substrate.

The next step is to remove portions 96 and 98 of the first and second photoresist layers adjacent the opening 94. Removal of the portions 96 and 98 exposes a portion of the upper surface 100 of the dielectric film. A reactive ion etching (RIE) machine which performs an oxygen plasma etch is preferred for this removal because the oxygen does not attack the dielectric film. The RIE pressure is preferably set at 200 milliTorr, the power is set for 100 Watts, and etching should be performed for about ten minutes.

Although not required, a water rinse may be performed to clean residue, if any, left behind by the RIE machine. Furthermore, baking the structure at 100° C. for ten minutes will reinforce the adhesion between the photoresist layer and the dielectric film; however, this baking is not required.

FIG. 9 illustrates the structure with the portions 96 and 98 removed. The next step is to remove portions 102 of the first photoresist layer 76 adjacent the opening 94. Removal of this portion 102 results in the first photoresist layer undercutting the second photoresist layer 78.

The portions 102 of the first photoresist layer are removed by repeating a sequence of DUV exposures and subsequent developments. Specifically, portions 104 of the second photoresist layer adjacent the opening 94 should first have their thickness reduced. Usually, the thickness of these portions is reduced when portions 96 and 98 are removed. An optional hot plate bake at 150° C. for one minute also helps to reduce the thickness of the portion 104.

Figure 10:
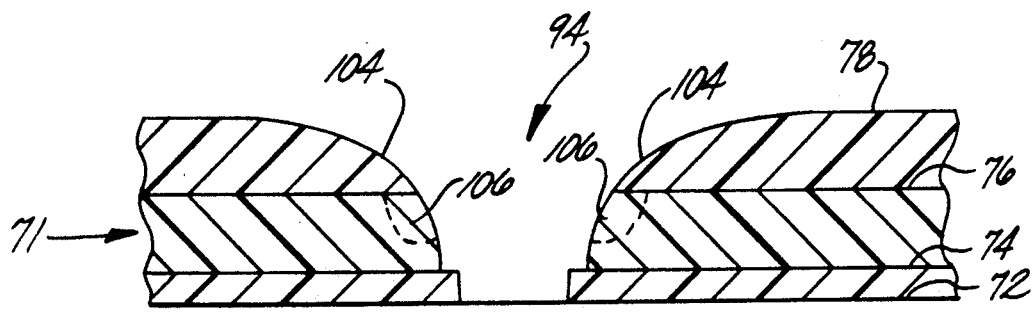
FIG. 10 is a cross-sectional view of the structure of FIG. 9 having a first undercutting exposed region in the first layer of photoresist.
Figure 11:
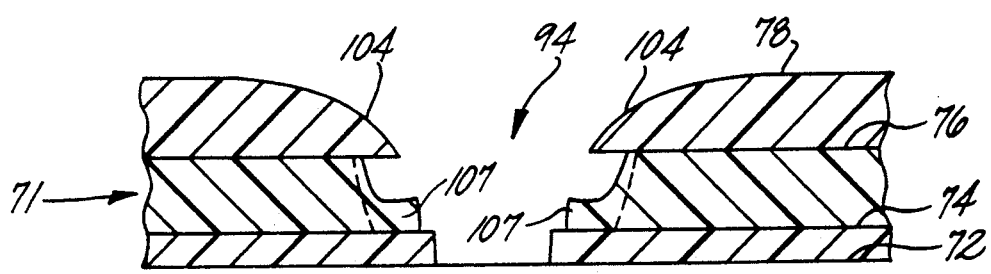
FIG. 11 is a cross-sectional view of the structure of FIG. 10 having a second undercutting exposed region in the first layer of photoresist.

Referring to FIG. 10, the structure is then exposed to ultraviolet light. The ultraviolet light penetrates through the thin portions 104 of the second photoresist layer and forms a first undercutting exposed region 106 in the first photoresist layer. The ultraviolet light should have the same wavelength as the ultraviolet light which was used to form the exposed region 90 in the first photoresist layer; thus, the ultraviolet light used is preferably DUV light having a wavelength of 260 nanometers. Exposure lasts for about 300 seconds.

The first undercutting exposed region 106 in the first photoresist layer 76 is then developed. The developing removes the first undercutting exposed region 106 and causes the first photoresist layer to undercut the second photoresist layer 78 adjacent the opening. Development lasts for about 30 seconds.

The first undercutting exposed region 106 which was formed and removed in the previous two steps is only a small part of portions 102. In order to completely remove the portions of the first photoresist layer adjacent the opening 94, the previous two steps of exposing and developing are preferably repeated at least one more time. Thus, referring to FIG. 11, the structure 71 is exposed to the same wavelength ultraviolet light (preferably DUV) a second time. The ultraviolet light again penetrates through the thin portions 104 of the second photoresist layer and forms second undercutting exposed regions 107 in the first photoresist layer. This second exposure also lasts for about 300 seconds.

Figure 12:
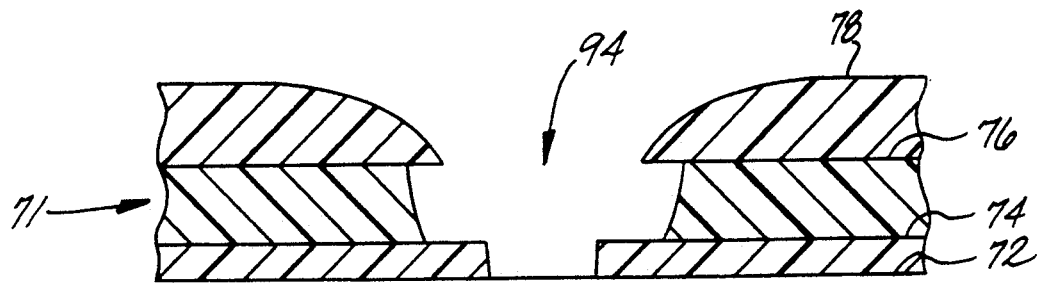
FIG. 12 is a cross-sectional view of the structure of FIG. 11, wherein the first layer of photoresist undercuts the second layer of photoresist.

The second undercutting exposed region 107 in the first photoresist layer is then developed. The developing removes the second undercutting exposed region and causes the first photoresist layer to further undercut the second photoresist layer adjacent the opening 94. Removal of the second undercutting exposed region 107 more completely removes the portions 102, as is illustrated by FIG. 12. The developer used is preferably the same developer which was used to remove the first undercutting exposed region 106. Development lasts for about 30 seconds.

The above sequence of exposing and developing to remove the undercutting portion may be repeated as many more times as is necessary in order to completely remove the desired portion of the underlying photoresist layer.

After the above sequence of exposures and developments, the structure 71 may be inspected to insure that all of the undercutting portion has been removed. An oxygen plasma cleaning step performed at 200 Watts for four minutes may be used to clean organic residue off of the structure surfaces. The structure may then be dipped into a 10:1 mixture of water and ammonium hydroxide solution for ten seconds to remove oxide from the previous oxygen plasma cleaning step.

Figure 13:
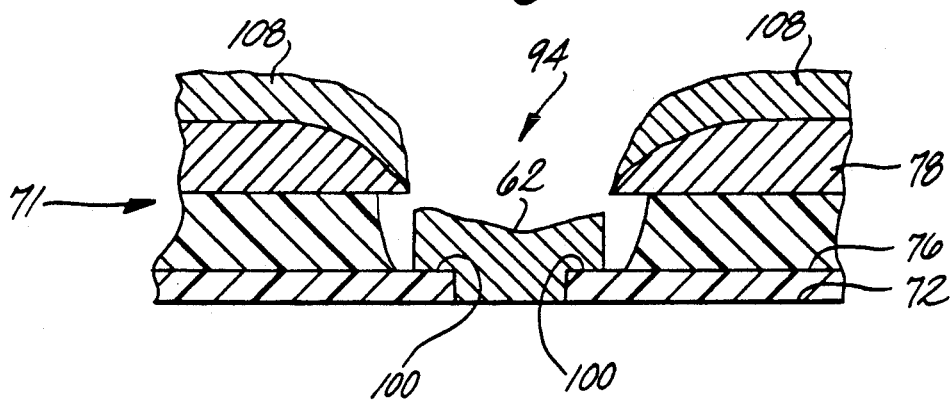
FIG. 13 is a cross-sectional view of the structure of FIG. 12 having metal deposited thereon.

Referring to FIG. 13, the next step is to deposit metal over the structure. Deposition of metal over the structure forms a first metal portion 62 in the opening 94 and on the exposed upper surface of the dielectric film 100, and a second metal portion 108 over the second photoresist layer 78. The amount of metal deposited is such that the first metal portion 62 does not make contact with the second metal portion 108. Because there is no connection between the first an second metal portions, the first metal portion is not disturbed when the second metal portion is later removed.

During the deposition of metal step, it is preferred to first deposit about 0.3 micrometers of an ohmic metal by way of electron beam evaporation. The ohmic metal insures that a good electrical contact is made between the first metal portion 62 and the substrate 72. Then, about 1.1 micrometers of a Schottky metal is deposited over the ohmic metal in order to make the first metal portion 62 thick so it can carry large currents. Preferably, for an electrode to n-type GaAs, the ohmic metal includes a layer of gold-germanium alloy, a layer of nickel, and a layer of gold. The Schottky metal preferably includes a layer of titanium, a layer of platinum, and a layer of gold.

Figure 14:
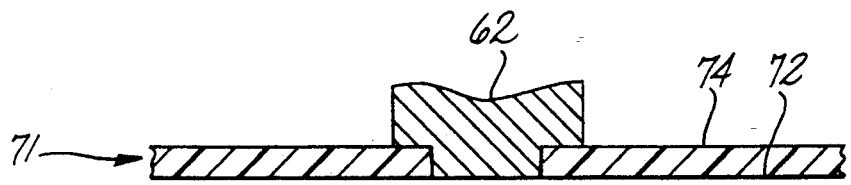
FIG. 14 is a cross-sectional view of the structure of FIG. 13 with the first and second layers of photoresist removed.

After the metal has been deposited over the structure, the first and second photoresist layers are removed. This results in the second metal portion 108 also being removed, as illustrated in FIG. 14. The first and second photoresist layers may be removed by soaking the structure in butyl acetone at 100° C. for 30 minutes. The structure 71 may then be sprayed with acetone to remove the unwanted metal portion 108. Another soaking in acetone for five minutes and then in alcohol for one minute will insure that the structure is thoroughly cleaned.

For additional cleaning, the structure may be soaked in Nophenol 922 (from EKC Technology) at 100° C. for ten minutes. The structure is then soaked in acetone for ten minutes, alcohol for one minute, and then given an oxygen plasma cleaning using the downstream technique for 90 seconds.

As discussed above, all or part of the dielectric film may be removed in order to form other electrodes and/or other transistor features. The presence of all or part of the dielectric film, however, will not significantly affect transistor performance.

Figure 15:
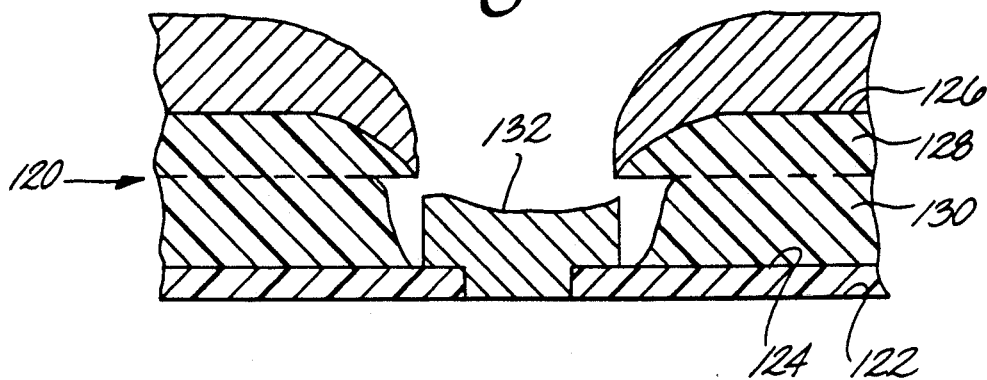
FIG. 15 is a cross-sectional view of an electrode formed in accordance with the present invention using only one layer of photoresist.

FIG. 15 illustrates a possible alternative method of forming the T-shaped electrode of the present invention. The method is substantially the same as shown in FIGS. 4 through 14 except that instead of two separate layers of photoresist only a single layer of photoresist 126 is applied to the dielectric film 124. The photoresist is of the type which can be treated so that a first region 130 and a second region 128 have different optical properties. In other words, the first and second regions 130 and 128 of the photoresist layer become exposed at different wavelengths of ultraviolet light. Because the first and second regions become exposed at different wavelengths of ultraviolet light, they serve the same function as the two separate layers of photoresist shown in FIGS. 4 through 13. Thus, after the photoresist layer has been treated so that the first region 130 and the second region 128 have different optical properties, the method of forming the electrode 132 can be performed substantially the same as illustrated in FIGS. 4 through It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method for forming a T-shaped transistor electrode comprising the steps of:
    forming a dielectric film on a semiconductor substrate;
    placing a photoresist layer over the dielectric film;
    removing a relatively narrower portion of the photoresist layer for forming a narrower opening at a location where an electrode is desired;
    etching an opening through the dielectric film corresponding to the narrower opening through the photoresist layer;
    removing a portion of the photoresist layer adjacent to each edge of the narrower opening for forming a wider opening through the photoresist layer;
    depositing metal through the opening in the dielectric film and through the wider opening in the photoresist layer for forming a T-shaped metal deposit; and
    removing the photoresist layer.

2. A method as recited in claim 1 wherein the step of forming a wider opening through the first mentioned photoresist layer comprises depositing a second layer of photoresist over the first layer of photoresist, and undercutting an edge of the second layer of photoresist adjacent to the narrower opening.

3. A method as recited in claim 1 wherein the placing step comprises:
    placing a first layer of photoresist on top of the dielectric film; and
    placing a second layer of photoresist on top of the first layer of photoresist, the second photoresist layer requiring a different wavelength of radiation for developing than the first photoresist layer.

4. A method as recited in claim 3 comprising the steps of:
   enlarging an opening through the second layer of photoresist corresponding to the narrower opening;
   exposing to radiation a portion of the first layer of photoresist adjacent to the narrower opening through an edge portion of the second layer of photoresist adjacent to the enlarged opening; and
   removing the exposed portion of the first layer of photoresist for undercutting the edge portion of the second layer of photoresist.

5. A method as recited in claim 4 comprising the steps of:
   depositing metal on top of the second layer of photoresist and through the enlarged opening through the second layer of photoresist with a sufficient thickness for filling the narrower opening through the dielectric film and at least a portion of the wider opening through the first layer of photoresist; and
   removing the layers of photoresist, thereby also removing metal deposited on the second layer of photoresist.

6. A method as recited in claim 3 comprising the steps of:
   exposing a region of the second photoresist layer to ultraviolet light for forming an exposed region in the second photoresist layer;
   developing and removing the exposed region in the second photoresist layer for forming an opening in the second photoresist layer;
   exposing a region of the first photoresist layer uncovered by the opening in the second photoresist layer to ultraviolet light for forming an exposed region in the first photoresist layer;
   developing and removing the exposed region in the first photoresist layer for forming an opening in the first photoresist layer; and
   etching a region of the dielectric film uncovered by the opening in the first photoresist layer for forming an opening in the dielectric film that exposes a portion of the substrate.

7. A method as recited in claim 3 comprising the step of:
   removing edge portions of the first and second layers of photoresist adjacent to the narrower opening for forming the wider opening and exposing a portion of the surface of the dielectric film.

8. A method as recited in claim 7 exposing to radiation an edge portion of the first layer of photoresist through an edge portion of the second layer of photoresist adjacent to the wider opening; and
   developing and removing the exposed portion in the first photoresist layer for forming an undercut beneath second photoresist layer.

9. A method as recited in claim 8 comprising the steps of:
   depositing metal on top of the second layer of photoresist and through the enlarged opening through the second layer of photoresist with a sufficient thickness for filling the narrower opening through the dielectric film and at least a portion of the wider opening through the first layer of photoresist, and less than sufficient for filling the undercut portion; and
   removing the layers of photoresist, thereby also removing metal deposited on the second layer of photoresist.

10. A method of forming a T-shaped electrode on a semiconductor substrate, comprising the steps of:
    forming a dielectric film on the substrate, the dielectric film having an upper surface;
    applying a first layer of photoresist on the upper surface of the dielectric film;
    applying a second layer of photoresist over the first layer of photoresist, the second layer of photoresist having a different optical property from the first layer of photoresist;
    selectively removing portions of the first and second photoresist layers and the dielectric film to form an opening to the substrate;
    removing additional portions of the first and second photoresist layers adjacent to the opening for exposing the upper surface of the dielectric film adjacent to the opening;
    removing a portion of the first adjacent to the opening to undercut the second photoresist layer;
    depositing metal in the opening and on the exposed upper surface of the dielectric film; and
    removing the first and second photoresist layers.

11. A method as recited in claim 10 wherein the step of applying a second layer of photoresist over the first layer of photoresist comprises applying a photoresist which is responsive to a different wavelength of ultraviolet light than the first layer of photoresist.

12. A method as recited in claim 10 wherein the step of selectively removing portions of the first and second photoresist layers and the dielectric film to form an opening to the substrate comprises the steps of:
    exposing a region of the second photoresist layer defined by a photo mask to ultraviolet light to form an exposed region in the second photoresist layer;
    developing and removing the exposed region in the second photoresist layer for forming an opening in the second photoresist layer;
    exposing a region of the first photoresist layer uncovered by the opening in the second photoresist layer to ultraviolet light for forming an exposed region in the first photoresist layer;
    developing and removing the exposed region in the first photoresist layer for forming an opening in the first photoresist layer; and
    etching a region of the dielectric film uncovered by the opening in the first photoresist layer for forming an opening in the dielectric film that exposes a portion of the substrate.

13. A method as recited in claim 10 wherein the step of removing additional portions of the first and second photoresist layers adjacent to the opening to expose the upper surface of the dielectric film adjacent to the opening is performed using a reactive ion etching machine.

14. A method as recited in claim 10 wherein the step of removing a portion of the first photoresist layer adjacent to the opening to undercut the second photoresist layer comprises the steps of:
    exposing the second photoresist layer to ultraviolet light for forming an undercutting exposed region in the first photoresist layer adjacent the opening;
    developing and removing the undercutting exposed region in the first photoresist layer to undercut the second photoresist layer;
    exposing the first photoresist layer to ultraviolet light for forming a second undercutting exposed region in the first photoresist layer adjacent the opening; and developing and removing the second undercutting exposed region in the first photoresist layer for further undercutting the second photoresist layer.

15. A method as recited in claim 10 wherein the step of depositing metal in the opening and on the exposed upper surface of the dielectric film comprises the steps of:

depositing an ohmic metal in the opening to the substrate and on the exposed upper surface of the dielectric film; and depositing a Schottky metal over the ohmic metal.

16. A method as recited in claim 15 wherein the ohmic metal comprises layers of gold-germanium, nickel, and gold, and the Schottky metal comprises layers of titanium, platinum, and gold.

17. A method of forming a T-shaped electrode on a semiconductor substrate, comprising the steps of:

forming a dielectric film on the substrate, the dielectric film having an upper surface;

applying a layer of photoresist on the upper surface of the dielectric film, the layer of photoresist having first and second regions, the first region being intermediate the second region and the dielectric film;

selectively removing portions of the photoresist layer and the dielectric film for forming an opening to the substrate;

removing the photoresist layer adjacent to the opening for exposing the upper surface of the dielectric film adjacent to the opening;

removing a portion of the first region of the photoresist layer adjacent to the opening to undercut the second region of the photoresist layer;

depositing metal in the opening and on the exposed upper surface of the dielectric film; and removing the photoresist layer.

* * * * *

UNITED STATES PATENT AND TRADEMARK OFFICE
CERTIFICATE OF CORRECTION

PATENT NO. : 5,288,660
DATED : February 22, 1994
INVENTOR(S) : Chang-Hwang Hua; Simon S. Chan; Ding-Yuan Day It is certified that error appears in the above-indentified patent and that said Letters Patent is hereby corrected as shown below:

On the title page: Item

[56] References Cited, U.S. PATENT DOCUMENTS, change
"5,155,653  10/1992  Atkinson..437/40" to
-- 5,155,053  10/1992  Atkinson..437/40 --.

Column 8, line 31, after "through" insert -- 14. --.

In the Claims:

Column 10, line 21, before "adjacent" insert
-- photoresist layer --.

Signed and Sealed this

Twenty-seventh Day of September, 1994

Attest:

BRUCE LEHMAN

*Attesting Officer*  *Commissioner of Patents and Trademarks*